United States Patent [19]

Aoai et al.

[11] Patent Number: 4,950,582

[45] Date of Patent: Aug. 21, 1990

[54] LIGHT-SENSITIVE COMPOSITION

[75] Inventors: Toshiaki Aoai; Keitaro Aoshima; Yasuo Okamoto, all of Shizuoka, Japan

[73] Assignee: Fuji Photo Film Co., Ltd., Minami-Ashigara, Japan

[21] Appl. No.: 176,196

[22] Filed: Mar. 31, 1988

[30] Foreign Application Priority Data

Apr. 20, 1987 [JP] Japan .................................. 62-97040

[51] Int. Cl.$^5$ .............................................. G03C 1/60
[52] U.S. Cl. ........................................ 430/175; 430/5; 430/155; 430/157; 430/165; 430/191; 430/192; 430/278; 430/281; 430/302; 430/326; 430/906
[58] Field of Search ............... 430/906, 192, 175, 155, 430/157, 165

[56] References Cited

U.S. PATENT DOCUMENTS

| | | | |
|---|---|---|---|
| 4,189,320 | 2/1980 | Hsieh ................................... | 430/192 |
| 4,247,616 | 1/1981 | Vikesland et al. .................. | 430/192 |
| 4,289,838 | 9/1981 | Rowe et al. ......................... | 430/906 |
| 4,387,151 | 6/1983 | Bosse et al. ......................... | 430/175 |
| 4,525,444 | 6/1985 | Doessel ............................... | 430/906 |
| 4,631,245 | 12/1986 | Pawlowski .......................... | 430/175 |
| 4,717,640 | 1/1988 | Stahlhofer .......................... | 430/906 |
| 4,877,711 | 10/1989 | Aoai et al. .......................... | 430/175 |

FOREIGN PATENT DOCUMENTS

| | | | |
|---|---|---|---|
| 2044788 | 10/1980 | United Kingdom ................ | 430/175 |
| 2185120 | 7/1987 | United Kingdom . | |

*Primary Examiner*—Charles L. Bowers, Jr.
*Attorney, Agent, or Firm*—Burns, Doane, Swecker & Mathis

[57] ABSTRACT

A light-sensitive composition comprises at least one water-insoluble and aqueous alkaline-soluble polyurethane resin having N-sulfonylamido, N-sulfonylureido or N-aminosulfonylamido groups. The light-sensitive composition is excellent in developing properties in an aqueous alkaline developer and coating properties. In addition, the images obtained from the composition are good in wear resistance and exhibit high adhesion to the substrate. Thus, the composition is very suitable for use in making IC circuits, photomasks and PS plates which provide lithographic printing plates exhibiting high printing durability.

10 Claims, No Drawings

LIGHT-SENSITIVE COMPOSITION

BACKGROUND OF THE INVENTION

1. Field of the Invention

The present invention relates to a light-sensitive composition suitable for use in making presensitized plates, IC circuits and photomasks and more particularly to a light-sensitive composition comprising a negative-working or positive-working light-sensitive compound and a polymeric compound having an excellent wear resistance.

2. Description of the Prior Art

A light-sensitive composition comprising o-naphthoquinone diazide compound and novolak type phenolic resin, which belongs to the positive-working system, has been known to be a very excellent light-senstive composition and has industrially been employed to produce presensitized plates for use in making lithographic printing plates (hereunder referred to as PS plate(s) for simplicity) and as photoresists.

However, such a light-sensitive composition exhibits various drawbacks to be eliminated because of the inherent properties of the novolak type phenolic resin used. For instance, it has a low adhesion to a substrate and is inferior in the coating properties, and the resultant film is fragile, inferior in wear resistance and has an insufficient printing durability when it is used, as lithographic printing plates and, therefore, the application thereof is limited to a narrow range.

In order to solve these problems associated with the aforementioned light-senstive composition, a variety of polymeric compounds have been examined as binders for such a light-sensitive composition. For example, Japanese Patent Publication for Opposition Purpose (hereinafter referred to as "J.P. KOKOKU") No. 52-41050 proposes polyhydroxystyrene or hydroxystyrene copolymers as such binders. These polymeric materials surely permit the improvement in film-forming properties of the composition. However, the resultant light-sensitive composition exhibits only a low wear resistance. In addition, Japanese Patent Un-examined Published Application (hereinafter referred to as "J.P. KOKAI") No. 51-34711 proposes, as such a binder, a polymeric compound having, in its molecular structure, structural units of acrylic acid derivatives. However, such a polymeric compound also suffers from disadvantages such that the range of proper conditions for developing such a polymer is narrow and that the wear resistance thereof is also insufficient.

Moreover, examples of known polymers having excellent wear resistance include polyurethane resins, for instance, U.S. Pat. No. 3,660,097 discloses a system comprising a combination of a positive-working diazonium compound and a substantially linear polyurethane resin. However, such a polyurethane resin carries no alkali-soluble group, thus has essentially insufficient solubility in an aqueous alkaline developer and, therefore, makes it very difficult to develop it without remaining films unremoved.

Alternatively, J.P. KOKAI No. 61-20939 discloses a light-sensitive composition in which an anionic polyurethane resin is used. Such an anionic polyurethane resin is water-soluble and thus it essentially differs from the water-insoluble polyurethane resin of the present invention. The anionic polyurethane resin exhibits insufficient solubility in an aqueous coating solvent, since it is water-soluble. In addition, it is less favorable to use in a light-sensitive layer of PS plates because it adversely affects the stability of the diazo compounds.

Most of the compounds used as light-sensitive materials in the negative-working systems are diazonium compounds. Among these, the most commonly used ones are diazo resins represented by a condensate of formaldehyde with p-diazodiphenylamine.

The light-sensitive composition employed to form light-sensitive layers of PS plates and composed of diazo resins are classified into two groups, one of which comprises only diazo resins and free from binders, as disclosed in U.S. Pat. No. 2,714,066; the other of which comprises a binder and a diazo resin as disclosed in U.S. Pat. No. 4,275,138. Recently, most of light-sensitive layers of such a PS plate comprise a polymer consisting of a diazo resin and a binder for imparting high printing durability to the light-sensitive layer.

As such light-sensitive layers, there have been known so-called alkaline-developable type layers, un-exposed areas of which are removed (or developed) with an aqueous alkaline developer and so-called solvent developable type layers, un-exposed areas of which are removed with an organic solvent type developer. Among these, the former attracts much attention from the viewpoint of safety and sanitation of the operators. This solubility behavior mainly depends on the quality of the binder utilized. There are known methods for imparting alkali-developable properties to the binders, for instance, a method comprising copolymerizing monomers having carboxyl group as disclosed in U.S. Pat. No. 4,275,138 cited above; and a method comprising introducing carboxyl groups into the polymer by reacting hydroxyl groups of polyvinyl alcohol with a cyclic acid anhydride such as phthalic anhydride. However, the resultant polymer is inferior in wear resistance because of the inherent structure thereof. Such a PS plate containing such a binder in a light-sensitive layer provides only a lithographic printing plate having low printing durability. On the contrary, polyvinyl acetal provides a tough and high wear resistant film, however, it only provides PS plates which are developable only with an organic solvent type developer.

Alternatively, polyurethane resins are known as polymers having high wear resistance. For instance, U.S. Pat. Nos. 3,660,097 and 4,337,307 disclose a system comprised of a combination of a diazonium compound and a substantially linear polyurethane resin and that composed of a polycondensate of diazonium salt and branched polyurethane resin. However, these polyurethane resins include no alkali-soluble group, thus essentially have insufficient solubility in an aqueous alkaline developer and, therefore, it is quite difficult to carry out development without remaining films. unremoved. Moreover, these polymers do not have sites which cause photoreaction with a diazonium compound used together therewith during exposure to light to effectively cause cross-linking and, therefore, the light-sensitive layer comprising such a polymer cannot form images exhibiting sufficient strength.

On the other hand, many attempts have been directed to the use of photopolymerizable composition as the light-sensitive image-forming layer of negative-working PS plates. For example, U.S. Pat. No. 3,458,311 discloses a basic composition comprising a polymer serving as a binder, a monomer and a photopolymerization initiator; U.S. Pat. No. 3,796,578 discloses a composition comprising a polymer serving as a binder into which unsaturated double bonds are introduced to improve the efficiency of hardening; U.S. Pat. Nos. 3,549,367 and 3,751,259 and U.K. Patent No. 1,388,492 disclose compositions comprising novel photopolymerization initiators. These compositions have been used practically in some applications. However, either of these light-sensitive compositions suffers from drawbacks that the sensitivity thereof it greatly influenced by the surface temperature of the PS plate during imagewise exposure to light and that these compositions strongly undergo polymerization inhibition due to oxygen during the imagewise exposure.

SUMMARY OF THE INVENTION

Accordingly, it is a purpose of the present invention to eliminate the aforementioned drawbacks associated with the conventional light-sensitive compositions and to thus provide a novel light-sensitive composition excellent in developability with an aqueous alkaline developer, which makes it possible to impart high printing durability to the resultant lithographic printing plates.

Under such circumstances, the inventors of the present invention have conducted various studies to achieve the aforementioned purpose, have found that the purpose of the invention can effectively be attained by using a novel light-sensitive composition and thus have completed the present invention.

According to the present invention, there is provided a light-sensitive composition comprising a polyurethane resin having N-sulfonylamido, N-sulfonylureido or N-aminosulfonylamido groups, which is water-insoluble and alkaline water-soluble.

DETAILED EXPLANATION OF THE INVENTION

The terms "N-sulfonylamido group", "N-sulfonylureido" and "N-aminosulfonylamido group" as used herein respectively mean —CO—NH—SO$_2$—, —NH—CO—NH—SO$_2$— and —CO—NH—SO$_2$—NH—.

In addition, the light-sensitive composition of the present invention can contain light-sensitive compounds selected from the group consisting of the following compounds or combinations thereof (i) to (iv):

(i) o-quinonediazide compounds;
(ii) negative-working diazonium compounds;
(iii) a combination of a polymerizable monomer and a photopolymerization initiator; and
(iv) a combination of a negative-working diazonium compound, a polymerizable monomer and a photopolymerization initiator.

The polyurethane resins and other components used in the present invention, the methods for preparing and using the light-sensitive composition of this invention will hereunder be explained in more detail.

(1) Polyurethane Resins

The polyurethane resins preferably used in the invention are ones having a structure, as the basic skeleton, derived from a reaction product of a diisocyanate compound represented by the following general formula (I) with a diol compound represented by the following general formula (II), (III), (IV) or (V):

$$OCN-R_1-NCO \quad (I)$$

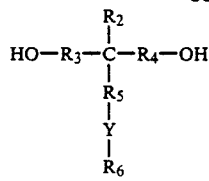

(II)

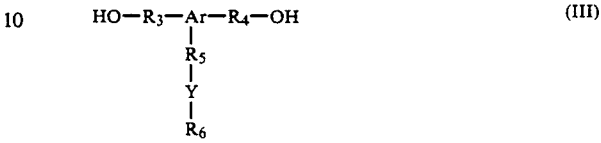

(III)

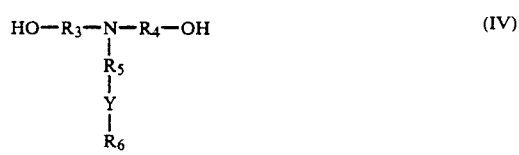

(IV)

$$HO-R_3-Y-R_4-OH \quad (V)$$

In the above general formulas, R$_1$ represents a bivalent aliphatic or aromatic hydrocarbon group which may have substituents preferably selected from the group consisting of alkyl groups, aralkyl groups, aryl groups, alkoxy groups and halogen atoms with the proviso that R$_1$ may have other functional groups such as ester, urethane, amido and ureido groups which are not reactive with the isocyanate groups.

R$_2$ represents a hydrogen atom or an alkyl, aralkyl, aryl, alkoxy or aryloxy group which may have substituents preferably selected from the group consisting of cyano, nitro, a halogen atom such as —F, —Cl, —Br, or —I, —CONH$_2$, —COOR$_7$, —NHCONHR$_7$, —NHCOOR$_7$, —NHCOR$_7$, —OCONHR$_7$ and —CONHR$_7$ wherein R$_7$ represents an alkyl group having 1 to 10 carbons atoms or an aralkyl group having 7 to 15 carbons atoms; and preferably a hydrogen atom, an alkyl group having 1 to 8 carbon atoms, or an aryl group having 6 to 15 carbon atoms.

R$_3$, R$_4$ and R$_5$ may be the same or different and each represents a single bond or a bivalent aliphatic or aromatic hydrocarbon group which may have substituents preferably selected from the group consisting of alkyl groups, aralkyl groups, aryl groups, alkoxy groups and halogen atoms; preferably an alkylene group having 1 to 20 carbon atoms, an arylene group having 6 to 15 carbon atoms and more preferably an alkylene group having 1 to 8 carbon atoms. In addition, R$_3$ to R$_5$ may optionally have other functional groups such as carbonyl, ester, urethane, amido, ureido and ether groups which never react with the isocyanate groups. Moreover, at least two or three of R$_2$ to R$_5$ may form a ring together with the carbon atoms to which these are bonded.

R$_6$ represents a monovalent aliphatic or aromatic hydrocarbon group which may have substituents preferably selected from the group consisting of alkyl groups, alkoxy groups and halogen atoms, preferably an alkyl group having 1 to 20 carbon atoms, an aryl group having 6 to 15 carbon atoms, or an aralkyl group having 7 to 15 carbon atoms, and more preferably an alkyl group having 1 to 8 carbon atoms or an aryl group having 6 to 10 carbon atoms.

Ar represents a trivalent aromatic hydrocarbon group optionally having substituents and preferably a trivalent aromatic hydrocarbon group having 6 to 15 carbon atoms.

Y denotes N-sulfonylamido, N-sulfonylureido or N-aminosulfonylamido group.

As the diisocyanate compounds represented by the formula (I), there may be mentioned such an aromatic diisocyanate compound as 2,4-tolylenediisocyanate, dimer of 2,4-tolylenediisocyanate, 2,6-tolylenediisocyanate, p-xylenediisocyanate, m-xylenediisocyanate, 4,4'-diphenylmethane diisocyanate, 1,5-naphthylene diisocyanate or 3,3'-dimethylbiphenyl-4,4'-diisocyanate; such an aliphatic diisocyanate compound as hexamethylene diisocyanate, trimethylhexamethylene diisocyanate, lysine diisocyanate or dimeric acid diisocyanate; such an alicyclic diisocyanate compound as isophorone diisocyanate, 4,4'-methylenebis(cyclohexylisocyanate), methylcyclohexane-2,4(or 2,6)-diisocyanate or 1,3-(isocyanatomethyl)-cyclohexane; and such a reaction product of a diol with a diisocyanate as an adduct of 1,3-butylene glycol and tolylenediisocyanate (molar ratio=1:2).

The diol compounds represented by the formulas (II), (III) and (IV) can be synthesized by, for instance, protecting hydroxyl group of the diol compound having a carboxyl group and represented by the following general formula (VI), (VII) or (VIII) and then reacting it with a compound represented by the following general formula (IX), (X), (XI) or (XII) in the presence of a base. Alternatively, these diol compounds may also be prepared by reacting such a diol with chlorosulfonyl isocyanate followed by reacting the resultant product with an amine compound of the general formula (XIII):

$$HO-R_3-\underset{\underset{COOH}{\underset{|}{R_5}}}{\overset{\overset{R_2}{|}}{C}}-R_4-OH \qquad (VI)$$

$$HO-R_3-\underset{\underset{COOH}{\underset{|}{R_5}}}{Ar}-R_4-OH \qquad (VII)$$

$$HO-R_3-\underset{\underset{COOH}{\underset{|}{R_5}}}{N}-R_4-OH \qquad (VIII)$$

$$R_6-SO_2-NCO \qquad (IX)$$
$$X-R_3-CO-NH-SO_2-R_6 \qquad (X)$$
$$X-R_3-NH-CO-NH-SO_2-R_6 \qquad (XI)$$
$$X-R_3-CO-NH-SO_2-NH-R_6 \qquad (XII)$$
$$R_6-NH_2 \qquad (XIII)$$

In these formulas, X represents a chlorine atom or a bromine atom and other substituents are the same as those defined above.

Moreover, compounds (X), (XI) and (XII) can respectively be prepared by, for instance, reacting a compound represented by the general formula (XIV) with a compound represented by the general formula (XV) (compound (X)); reacting a compound represented by the general formula (XVI) with compound (XV) (compound (XI)) or reacting a compound (XVII) with chlorosulfonyl isocyanate followed by reacting these products with an amine compound represented by the general formula (XIII) (compound (XII)):

$$X-R_3-COCl \qquad (XIV)$$
$$R_6-SO_2-NH_2 \qquad (XV)$$
$$X-R_3-NCO \qquad (XVI)$$
$$X-R_3-COOH \qquad (XVII)$$

In addition, diols (V) can be prepared by, for instance, reacting compound (XIV) with a compound represented by the general formula (XVIII), reacting compound (XVI) with compound (XVIII) or reacting compound (XVIII) with chlorosulfonyl isocyanate, followed by reacting the resultant products with a compound represented by the general formula (XIX) to hydroxylate the products:

$$X-R_4-SO_2-NH_2 \qquad (XVIII)$$
$$X-R_4-NH_2 \qquad (XIX)$$

Specific examples of the diol compounds represented by the general formulas (II) to (V) include as follows:

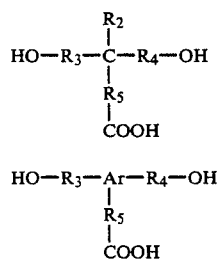
(No. 1)

$$HO-CH_2-\underset{\underset{CO-NH-SO_2-\text{Ph}}{|}}{\overset{\overset{CH_3}{|}}{C}}-CH_2-OH$$

(No. 2)

$$HO-CH_2-\underset{\underset{CO-NH-SO_2-\text{Ph}-CH_3}{|}}{\overset{\overset{CH_3}{|}}{C}}-CH_2-OH$$

(No. 3)

$$HO-CH_2-\underset{\underset{CO-NH-SO_2C_4H_9}{|}}{\overset{\overset{CH_3}{|}}{C}}-CH_2-OH$$

-continued
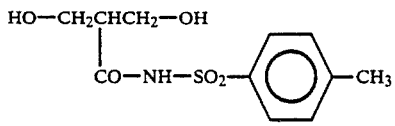 (No. 4)
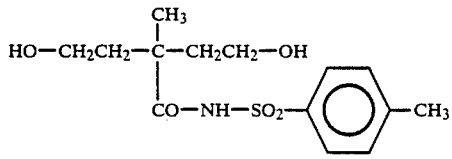 (No. 5)
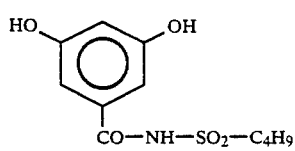 (No. 6)
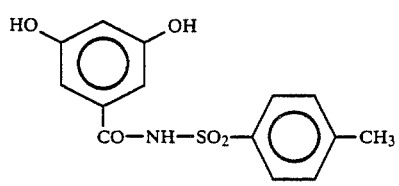 (No. 7)
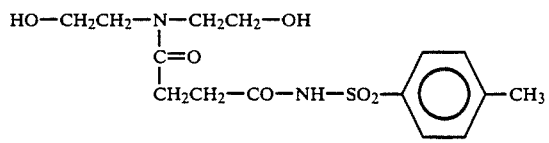 (No. 8)
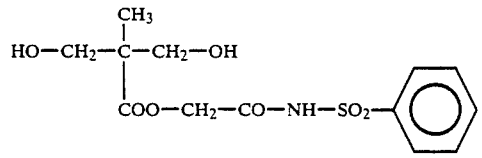 (No. 9)
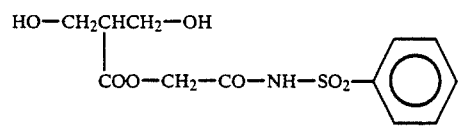 (No. 10)
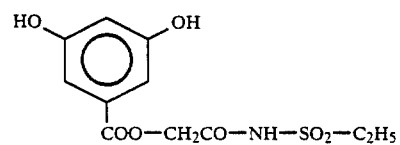 (No. 11)
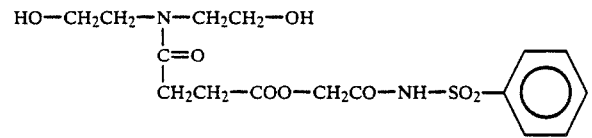 (No. 12)
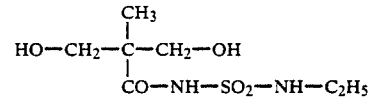 (No. 13)

-continued

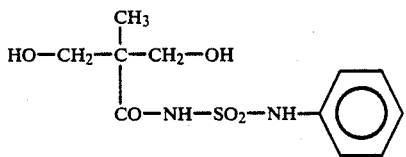 (No. 14)

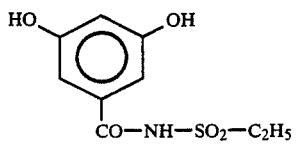 (No. 15)

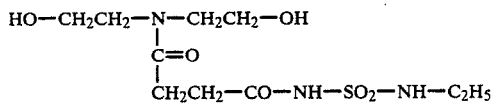 (No. 16)

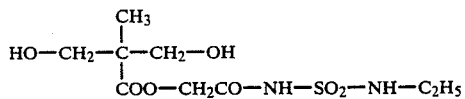 (No. 17)

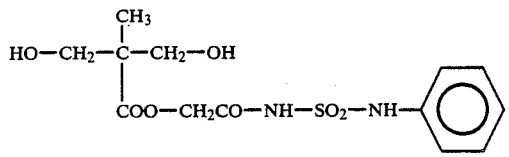 (No. 18)

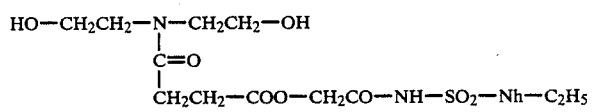 (No. 19)

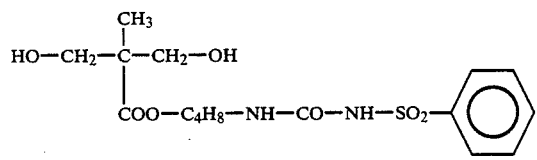 (No. 20)

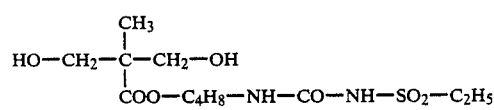 (No. 21)

HO—CH$_2$CO—NH—SO$_2$—C'hd 3H$_6$—OH (No. 22)
HO—CH$_2$CO—NH—SO$_2$—NH—C$_2$H$_4$—OH (No. 23)
HO—C$_3$H$_6$CO—NH—SO$_2$—NH—C$_2$H$_4$—OH (No. 24)

The polyurethane resins as used herein may also be synthesized by reacting a polyurethane resin having carboxyl groups, which is a reaction product of a diisocyanate compound (I) and a diol compound (VI), (VII) or (VIII), with a compound (IX), (X), (XI) or (XII) in the presence of a base; or further reacting the foregoing resin with chlorosulfonyl isocyanate followed by reacting the product with an amine compound (XIII).

Specific examples of diol compounds represented by the general formula (VI), (VII) or (VIII) and having carboxyl groups include 3,5-dihydroxybenzoic acid, 2,2bis(hydroxymethyl)-propionic acid, 2,2-bis(2-hydroxyethyl)-propionic acid, 2,2-bis(3-hydroxypropyl)-propionic acid, bis(hydroxymethyl)-acetic acid, bis(4-hydroxyphenyl)-acetic acid, 4,4-bis(4-hydroxyphenyl)-pentanoic acid, tartaric acid and N,N-bis(2-hydroxyethyl)-3-carboxy-propionamide.

If the polyurethane resins thus prepared are used in combination with negative-working diazonium compounds, hydroxyl groups and/or nitrile groups may be introduced into the polyurethane resins used in the present invention for the purpose of improving the photocross-linking efficiency of the diazonium compounds. The introduction of these groups into the polyurethane resins may be achieved, for instance, by reacting the polyurethane resins with a halogen compound having such a hydroxyl and/or nitrile groups in the presence of a base.

It is also possible to form the polyurethane resins as used herein from diisocyanate compound (I) and at least two diol compounds selected from the group consisting of those represented by the general formulas (II) to (V).

The light-sensitive composition of the present invention may also contain other diol compounds which do not have an N-sulfonylamido, N-sulfonylureido or N-aminosulfonylamido group and have other substituents non-reactive with the isocyanate groups in an amount so as not to lower the alkali developing ability of the composition.

Specific examples of such diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-beta-hydroxyethoxycyclohexane, cyclohexane dimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxyethyl ether, p-xylene glycol, dihydroxyethyl sulfone, bis(2-hydroxyethyl)-2,4-tolylene dicarbamate, 2,4-tolylene-bis(2-hydroxyethylcarbamide), bis(2-hydroxyethyl)-m-xylylene dicarbamate and bis(2-hydroxyethyl)-isophthalate.

These polyurethane resins may be used alone or in can be synthesized by heating the foregoing diisocyanate compound and the diol compound in an aprotic solvent in the presence of a catalyst having known activity depending on the reactivity of the reactants. The molar ratio of the diisocyanate to diol compounds used preferably ranges from 0.8:1 to 1.2:1. In this connection, if isocyanate groups remain on the ends of the resulting polymers, these isocyanate groups may be treated with alcohols or amines to finally obtain products having no isocyanate groups.

The molecular weight of the polyurethane resins as used herein is preferably at least 1,000 and more preferably 5,000 to 100,000 expressed as the weight averaged molecular weight.

The polyurethane resins may be used alone or in combination. The light-sensitive compositions of this invention comprises these polyurethane resins in an amount of about 5 to 90% by weight and preferably about 10 to 60% by weight.

(2) Positive-working o-Quinonediazide Compounds

In the light-sensitive composition of this invention, positive-working o-quinonediazide compounds may also be used and among these, preferred are o-naphthoquinonediazide compounds.

Most preferred o-naphthoquinonediazide compounds as used herein are esters of 1,2-diazonaphthoquinone sulfonic acid chloride and pyrogallol-acetone resin as disclosed in U.S. Pat. No. 3,635,709. Examples of other suitable o-quinonediazide compounds include esters of 1,2-diazonaphthoquinone sulfonic acid chloride and phenolformaldehyde resin as disclosed in U.S. Pat. Nos. 3,046,120 and 3,188,210. Other useful o-naphthoquinonediazide compounds are known in the art and described in many patents. For instance, there may be mentioned such compounds as those disclosed in J.P. KOKAI Nos. 47-5303, 48-63802, 48-63803, 48-96575, 49-38701, and 48-13354, J.P. KOKOKU Nos. 41-11222, 45-9610 and 49-17481, U.S. Pat. Nos. 2,797,213; 3,454,400; 3,544,323; 3,573,917; 3,674,495 and 3,785,825, U.K. Patent Nos. 1,227,602; 1,251,345; 1,267,005; 1,329,888 and 1,330,932 and German Patent No. 854,890.

The light-sensitive composition of the present invention can contain these positive-working o-quinonediazide compounds which may be used alone or in combination in an amount of 10 to 50% by weight and more preferably 20 to 40% by weight of the total weight of the composition.

(3) Negative-working Diazonium Compounds

Examples of diazonium compounds used in the invention are those disclosed in U.S. Pat. Nos. 3,867,147 and 2,632,703 and, in particular, useful ones are diazo resins represented by condensates of aromatic diazonium salts with, for instance, active carbonyl-containing compounds such as formaldehyde. Preferred diazo resins are hexafluorophosphates, tetrafluoroborates and phosphates of condensates of p-diazodiphenylamine with formaldehyde or acetaldehyde. In addition, preferred examples thereof also include sulfonates such as p-toluene sulfonate, dodecylbenzene sulfonate and 2-methoxy-4-hydroxy-5-benzoyl benzene sulfonate, phosphinic acid salts such as benzene phosphinate, salts with hydroxyl group-containing compound such as salt with 2,4-dihydroxybenzophenone and organic carboxylates of condensates of p-diazodiphenylamine and formaldehyde, as disclosed in U.S. Pat. No. 3,300,309.

Moreover, preferred examples thereof also include those obtained by condensing 3-methoxy-4-diazodiphenylamine with 4,4'-bis-methoxy-methyl diphenyl ether and then converted to a mesitylene sulfonate such as those disclosed in U.S. Pat. No. 3,867,147.

These diazonium compounds may be used alone or in combination in the light-sensitive composition of the present invention and may be included therein in an amount of 1 to 50% by weight, preferably 3 to 20% by weight on the basis of the total weight of the composition.

(4) Polymerizable Monomer/Photopolymerization Initiator

Monomers which may be added to the light-sensitive composition of the present invention are monomers or oligomers having a boiling point of not less than 100° C. at normal pressure, a molecular weight of not more than 10,000 and carrying at least one, preferably at least two addition polymerizable ethylenically unsaturated groups per molecule. Examples of such monomers or oligomers include monofunctional acrylates or methacrylates such as polyethylene glycol mono(meth)acrylate, polypropylene glycol mono(meth)acrylate, phenoxyethyl (meth)acrylate; polyethylene glycol di(meth)acrylate, polypropylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, tri(acryloyloxyethyl)-isocyanate; products obtained by adding ethylene oxide or propylene oxide to a polyol such as glycerin or trimethylolethane and then (meth)acrylating the adduct; urethane acrylates such as those disclosed in J.P. KOKOKU Nos. 48-41708 and 50-6034 and J.P. KOKAI No. 51-37193; polyester acrylates such as those disclosed in J.P. KOKAI No. 48-64183 and J.P. KOKOKU Nos. 49-43191 and 52-30490; polyfunctional acrylates or methacrylates such as epoxy acrylates obtained by reacting epoxy resins and (meth)acrylic acid. It is also possible to use those disclosed, as photohardenable monomers and oligomers, in NIPPON SETCHAKU KYOKAI SHI (Journal of Japan Adhesives Association), Vol. 20, No. 7, pp 300–308.

The weight ratio between these monomers of oligomers and the polyurethane resins used in the present invention preferably ranges from 5:95 to 70:30, more preferably 10:90 to 50:50.

The light-sensitive composition of this invention may contain at least one photopolymerization initiator and examples thereof are vicinal polyketaldonyl compounds as disclosed in U.S. Pat. No. 2,367,660; alpha-carbonyl compounds as disclosed in U.S. Pat. Nos. 2,367,661 and 2,367,670; acyloin ethers as disclosed in U.S. Pat. No. 2,448,828; aromatic acyloin compounds substituted with hydrocarbons at alpha position as disclosed in U.S. Pat. No. 2,722,512; polynuclear quinone compounds as disclosed in U.S. Pat. Nos. 3,046,127 and 2,951,758; a combination of triarylimidazole dimer/p-aminophenyl ketone as disclosed in U.S. Pat. No. 3,549,367; benzothiazole type compounds as disclosed in U.S. Pat. No. 3,870,524; acridine or phenazine compounds as disclosed in U.S. Pat. No. 3,751,259; and oxadiazole compounds as disclosed in U.S. Pat. No. 4,212,970.

Preferred examples of the photopolymerization initiators are trihalomethyl-s-triazine compounds or trihalomethyl-oxadiazole compounds represented by the following general formula (XX) or (XXI):

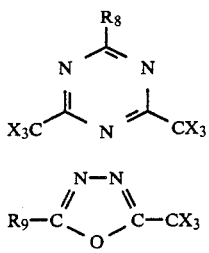

(XX)

(XXI)

In the above formulas, $R_9$ represents a substituted or unsubstituted aryl or alkenyl group; and $R_8$ represents $R_9$, a substituted or unsubstituted alkyl group or $-CX_3$ wherein X denotes chlorine or bromine atom.

Compounds (XX) include, for instance, compounds disclosed in Bull. Chem. Soc. Japan, 1969, Vol. 42, p 2924; and those disclosed in U.K. Patent No. 1,388,492 and German Patent Nos. 2,718,259 and 3,337,024.

Specific examples thereof are 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(-trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, 2-(alpha,alpha,beta-trichloroethyl)-4,6-bis(trichloromethyl)-s-triazine, 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-(4-(2-ethoxyethyl)-naphtho-1-yl)-4,6-bis(trichloromethyl)-s-triazine, 2-(4,7-dimethoxy-naphtho-1-yl)-4,6-bis(trichloromethyl)-s-triazine, 2-(acenaphtho-5-yl)-4,6-bis(-trichloromethyl)-s-triazine and 2-(4-styrylphenyl)-4,6-bis(trichloromethyl)-s-triazine.

In addition, compounds (XXI) include, for instance, those disclosed in J.P. KOKAI Nos. 54-74728, 55-77742 and 59-148784. Specific examples thereof are 2-styryl-5-trichloromethyl-1,3,4-oxadiazole, 2-(4-chlorostyryl)-5-trichloromethyl-1,3,4-oxadiazole, 2-(4-methylstyryl)-5-trichloromethyl-1,3,4-oxadiazole, 2-(4-methyoxystyryl)-5-trichloromethyl-1,3,4-oxadiazole, 2-(4-butoxystyryl)-5-trichloromethyl-1,3,4-oxadiazole, 2-(4-styryl-styryl)-5-trichloromethyl-1,3,4-oxadiazole, 2-phenyl-5-trichloromethyl-1,3,4-oxadiazole, 2-(4-methoxyphenyl)-5-trichloromethyl-1,3,4-oxadiazole, 2-(3,4-dimethoxyphenyl)-5-trichloromethyl-1,3,4-oxadiazole, 2-(4-styrylphenyl)-5-trichloromethyl-1,3,4-oxadiazole and 2-(1-naphthyl)-5-trichloromethyl-1,3,4-oxadiazole.

The light-sensitive composition according to the present invention may optionally include at least one sensitizing agent. Specific examples of sensitizing agents are aromatic thiazole compounds as disclosed in J.P. KOKOKU No. 59-28328; merocyanine dyes as disclosed in J.P. KOKAI No. 54-151024; aromatic thiopyrylium salts or aromatic pyrylium salts as disclosed in J.P. KOKAI No. 58-40302; and light absorber such as 9-phenylacridine, 5-nitroacenaphthene and ketocoumarin. Combinations of these compounds with a hydrogen donor such as N-phenyl glycine, 2-mercaptobenzothiazole or ethyl N,N'-dimethylaminobenzoate can effectively be used in the invention.

It is sufficient to use such photopolymerization initiators and/or sensitizing agents, in the composition of the invention, in an amount of 0.01 to 20% by weight on the basis of the total weight of the photopolymerizable ethylenically unsaturated compounds and the polyurethane resins and preferred amount thereof ranges from 0.5 to 10% by weight.

(5) Other Components

In addition to the aforementioned polyurethane resins, the light-sensitive composition of this invention may further comprises known alkaline-soluble polymeric compounds such as phenol-formaldehyde resin, cresol-formaldehyde resin, phenol-modified xylene resin, polyhydroxystyrene, halogenated polyhydroxystyrene and carboxyl group-containing epoxy resin, polyacetal resin, acrylic resin and methacrylic resin. These alkaline-soluble polymers may be used in an amount of not more than 70% by weight of the total composition.

Furthermore, the light-sensitive composition of the present invention may contain agents or composition for obtaining a visible image immediately after imagewise exposure; dyes or pigments for dyeing images; stabilizers; surfactants; plasticizers or other fillers.

When the polyurethane resins of the present invention are used together with positive-working o-quinonediazide compounds, a cyclic acid anhydride may be added to the light-sensitive composition for enhancing the sensitivity thereof. Examples thereof include phthalic anhydride, tetrahydrophthalic anhydride, hexahydrophthalic anhydride, 3,6-endoxy-$\Delta^4$-tetrahydrophthalic anhydride, tetrachlorophthalic ahydride, maleic anhydride, chloromaleic ahydride, alpha-phenylmaleic anhydride, succinic anhydride and pyromellitic anhydride. Thus, the sensitivity of the light-sensitive composition of the present invention would be increased at most three times as large as that of the composition free from such anhydride by incorporating the cyclic acid anhydride in an amount of 1 to 15% by weight of the composition.

Typical examples of the agents or compositions for obtaining a visible image immediately after imagewise exposure are combinations of light-sensitive compounds which release acids during exposure to light and organic dyes capable of forming salts therewith. Specific examples thereof are a combination of o-naphthoquinonediazide-4-sulfonic acid halogenide and a salt-forming organic dye as disclosed in J.P. KOKAI Nos. 50-36209 and 53-8128; and a combination of a trihalomethyl compound and a salt-forming organic dye as disclosed in J.P. KOKAI Nos. 53-36223 and 54-74728. As the image-dyeing agents, it is also possible to use dyes other than the foregoing salt-forming organic dyes. Preferred dyes inclusive of salt-forming organic dyes are, for instance, oil-soluble dyes and basic dyes. Typical examples thereof include Oil Yellow #101, Oil Yellow #130, Oil Pink #312, Oil Green BG, Oil Blue BOS, Oil Blue #603, Oil Black BY, Oil Black BS, Oil Black T-505 (all these are manufactured and sold by ORIENT CHEMICAL INDUSTRIES, LTD.): Victoria Pure Blue, Crystal Violet (CI 42555), Methyl Violet (CI 42535), Rhodamine B (CI 45170B), Malachite Green (CI 42000) and Methylene Blue (CI 52015).

When the polyurethane resins of the invention are used in combination with diazonium compounds, stabilizers such as phosphoric acid, phosphorous acid, oxalic acid, p-toluene sulfonic acid, dipicolinic acid, malic acid, tartaric acid, 2-methoxy-4-hydroxy-5-benzoyl-benzenesulfonic acid, butylnaphthalenesulfonic acid, and p-hydroxybenzenesulfonic acid may be added to the light-sensitive composition.

When utilizing a combination of a polymerizable monomer and a photopolymerization initiator, it is desirable that a small amount of a heat-polymerization inhibitor be added to the light-sensitive composition of the invention to inhibit unnecessary heat-polymerization of the polymerizable ethylenically unsaturated compounds during preparation and/or storage of the light-sensitive composition. Suitable heat-polymerization inhibitors are, for instance, hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), 2-mercaptobenzimidazole and cerium-(III) N-nitrosophenyl hydroxylamine.

The light-sensitive composition of the present invention is dissolved in a solvent capable of dissolving the foregoing components and is coated onto a substrate. Examples of such solvents are methanol, ethanol, isopropanol, n-butanol, tert-butanol, ethylene dichloride, cyclohexanone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propylacetate, N,N-diemthyl-formamide, tetrahydrofuran, dioxane, dimethyl sulfoxide, toluene and ethyl acetate. These solvents may be used alone or in combination. The concentration of such a coating solution (content of the components) is 2 to 50% by weight. The amount of the composition to be coated may vary dependent upon the applications. As to a PS plate, the coated amount thereof weighed after drying preferably ranges from 0.5 to 3.0 g/m$^2$. The lower the coated amount, the higher the sensitivity of the light-sensitive layer obtained while physical properties of the light-sensitive layer is lowered.

As the substrate onto which the light-sensitive composition of the present invention is applied, there may be named paper, paper laminated with a plastic film such as polyethylene, polypropylene or polystyrene film; metal plates such as aluminum (inclusive of alloys thereof), zinc and copper plates; plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, plycarbonate and polyvinyl acetal films; and paper or plastic films laminated with foils of the foregoing metals or those on which a layer of such a metal is deposited. Among these, particularly preferred are aluminum plates because of their high dimensional stability and low cost. Moreover, it is also preferable to use a composite sheet, for instance, that comprised of a polyethylene terephthalate film to which an aluminum sheet is bonded as disclosed in J.P. KOKOKU No. 48-18327.

The substrates having a metal, in particular, aluminum surface are preferably subjected to a surface treatment such as graining, dipping treatment in an aqueous solution of sodium silicate, potassium fluorozirconate or a phosphate; or anodization. Moreover, it is also preferable to use an aluminum plate dipped in an aqueous solution of sodium silicate as disclosed in U.S. Pat. No. 2,714,066; aluminum plates which is anodized followed by dipping it in an aqueous solution of an alkali metal silicate as described in J.P. KOKOKU No. 47-5125; and an aluminum substrate which is treated by a combination of mechanical surface roughening and electrolytic surface roughening treatments as described in U.S. Pat. No. 4,476,006.

The aforementioned anodization treatment can be carried out by passing an electric current through an aluminum plate serving as the anode in an electrolyte such as an aqueous solution or non-aqueous solution of inorganic acid, for instance, phosphoric acid, chromic acid, sulfuric acid and boric acid; or an organic acid, for example, oxalic acid or sulfamic acid or a combination of these solutions.

Alternatively, substrates obtained by graining, anodizing and then sealing aluminum plates are also preferable. Such a sealing treatment may be carried out by dipping the substrate in an aqueous solution of sodium silicate, hot water or a hot aqueous solution of an inorganic salt or an organic salt or by subjecting it to water steambath treatment.

The silicate electrodeposition as disclosed in U.S. Pat. No. 3,658,662 is also effective as the surface treatment.

The light-sensitive composition of the present invention coated on a substrate provides positive or negative relief with respect to an original by exposing the composition to light through a transparency carrying line drawing and half-tone dots thereon and then developing it with an aqueous alkaline developer.

In the process for imagewise exposing the layer composed of the composition to light, a light source such as carbon arc lamp, mercury lamps, xenon lamp, tungsten lamp and metal halide lamps may be used.

The light-sensitive composition of the present invention is excellent in coating properties during applying it to a substrate. In addition, it is superior in developing properties of the exposed areas when it is developed with an aqueous alkaline solution after coating, drying and imagewise exposing to light. Moreover, the resultant relief is good in wear resistance and adhesion to the substrate. Therefore, if the resultant product is used as a lithographic printing plate, a great deal of good printed matters would be obtained.

The light-sensitive composition of the present invention will hereunder be explained in more detail with reference to the following working non-limitative examples and the effects practically attained will also be discussed in comparison with Comparative Examples given below.

PREPARATION EXAMPLE 1

To a 500 ml three necked round bottomed flask provided with a condenser and a stirring machine, there were charged 125 g (0.50 moles) of 4,4'-diphenylmethane diisocyanate and 67 g (0.50 moles) of 2,2-bis(hydroxymethyl)-propionic acid and then 290 ml of dioxane was introduced thereinto to dissolve them. As a catalyst, 1 g of N,N-diethylaniline was added to the solution and the mixture was refluxed under heating for 6 hours while stirring. Then, the reaction solution was poured into a mixture of water (4000 ml) and acetic acid (40 ml) under stirring to precipitate white polymer particles. The polymer obtained was filtered off, washed with water and dried in vacuo to recover 185 g of the polymer.

The molecular weight thereof was estimated by Gel Permeation Chromatography (GPC) to be 28,000 (weight averaged molecular weight) with respect to a standard of polystyrene. In addition, the content of carboxyl groups (or acid value) of the polymer as determined by titration was 2.47 meq./g.

The polymer (40 g) was placed in a 300 ml three necked round bottomed flask equipped with a condenser and a stirring machine and 200 ml of DMF was added thereto to dissolve the polymer. 10.0 g (0.099 moles) of triethylamine was added to the solution followed by heating the mixture at 80° C. and adding 19.5 g (0.099 moles) of toluenesulfonyl isocyanate thereto. Stirring was continued for additional 2 hours.

After completing the reaction, the reaction solution was poured into a mixture of 4000 ml of water and 200 ml of acetic acid while stirring to precipitate white polymer particles. The resulting polymer was filtered off, washed with water and dried in vacuo to obtain 49 g of the polymer.

The formation of N-toluenesulfonylamido groups was confirmed by NMR measurement and the acid value was determined by titration and was found to be 2.01 meq./g (hereunder referred to as polyurethane (a) used in the present invention).

PREPARATION EXAMPLE 2

To a 500 ml three necked round bottomed flask provided with a condenser and a stirring machine, there were charged 94 g (0.50 moles) of m-xylylene diisocyanate and 144 g (0.50 moles) of 2,2-bis(hydroxymethyl)-N-toluenesulfonyl propionamide of the following formula:

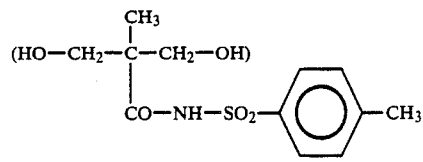

and then 330 ml of dioxane was introduced into the flask to dissolve them. As a catalyst, 1 g of N,N-diethylaniline was added to the solution and the mixture was refluxed under heating for 6 hours while stirring. Then, the reaction solution was poured into a mixture of water (4000 ml) and acetic acid (40 ml) under stirring to precipitate white polymer particles. The polymer obtained was filtered off, washed with water and dried in vacuo to recover 229 g of the polymer.

The weight averaged molecular weight thereof was estimated by GPC to be 19,000 with respect to a standard of polystyrene. In addition, the acid value of the resulting polymer as determined by titration was 2.05 meq./g (hereunder referred to as polyurethane (b) used in the invention).

PREPARATION EXAMPLES 3 TO 14

Polyurethane resins used in the invention were prepared in accordance with the procedures similar to those in Preparation Example 1 or 2, employing diisocyanates and diol compounds listed in the following Table I. The weight averaged molecular weight of these polyurethane resins was determined by GPC while the acid value thereof was measured by titration. The acid values obtained are listed in Table I. The weight averaged molecular weight of these polymers observed was in the range of 12,000 to 38,000.

TABLE I
| Polyurethane used in the Invention | Diisocyanate Compound used (mole %) | Diol Compound used (mole %) | Sulfonyl Isocyanate Compound (by the process of Preparation Example 1) | Acid value (meq/g) |
|---|---|---|---|---|
| (c) | 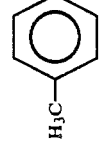 |  |  | 1.95 |
| (d) | $OCN(CH_2)_6-NCO$ (100) |  |  | 2.04 |
| (e) |  | 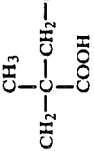 | 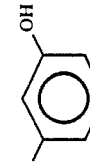 | 1.78 |
| (f) | $OCN(CH_2)_6-NCO$ (100) | 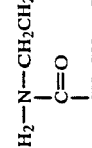 | — | 1.96 |
| (g) |  |  | — | 2.01 |
| (h) |  |  | — | 1.93 |

TABLE I-continued
| Polyurethane used in the Invention | Diisocyanate Compound used (mole %) | Diol Compound used (mole %) | Sulfonyl Isocyanate Compound (by the process of Preparation Example 1) | Acid value (meq/g) |
|---|---|---|---|---|
| (i) | 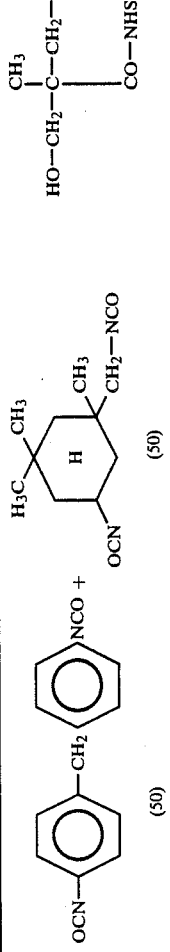 (50) + 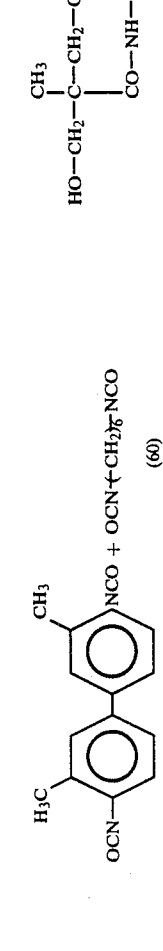 (50) | 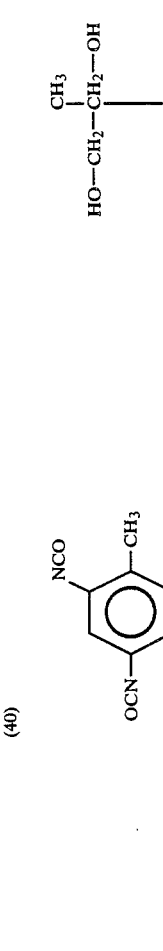 (100) | — | 1.87 |
| (j) | 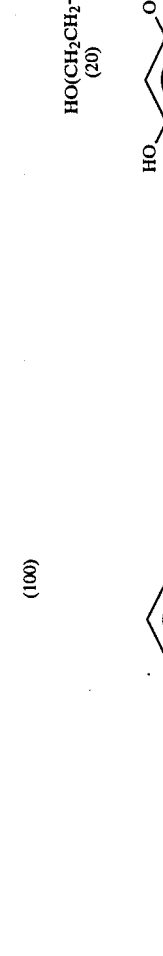 (40) + OCN—(CH$_2$)$_6$—NCO (60) | 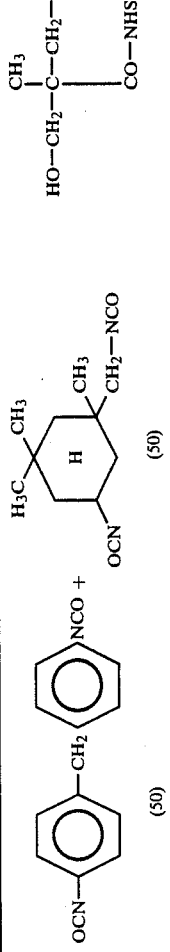 (100) | — | 1.99 |
| (k) | 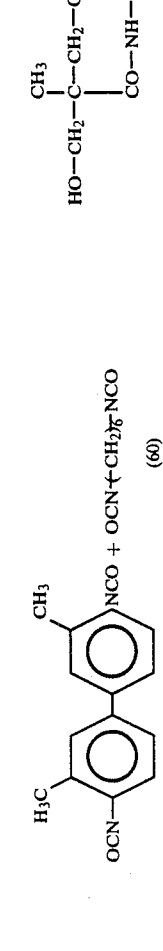 (100) | 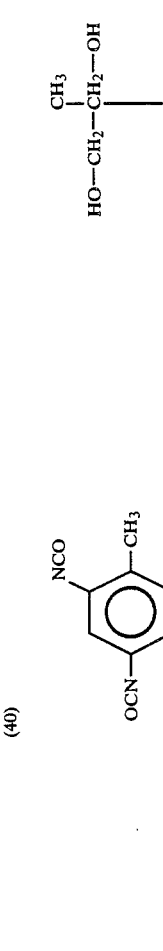 (80) + HO(CH$_2$CH$_2$—O)$_7$H (20) | — | 1.84 |
| (l) | 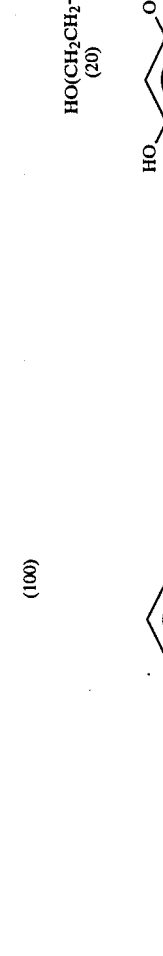 (100) | 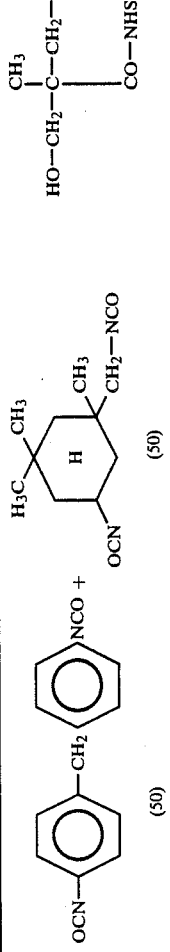 (100) | — | 2.18 |
| (m) | 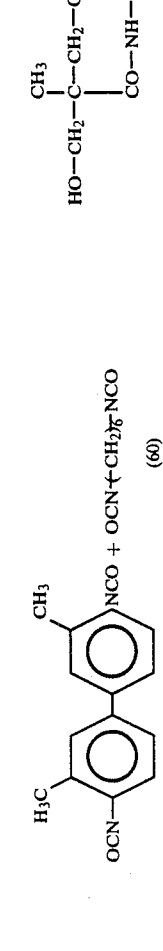 (100) | HO—CH$_2$—CO—NH—SO$_2$—NH—C$_2$H$_4$—OH (100) | — | 2.20 |

TABLE I-continued

| Polyurethane used in the Invention | Diisocyanate Compound used (mole %) | Diol Compound used (mole %) | Sulfonyl Isocyanate Compound (by the process of Preparation Example 1) | Acid value (meq/g) |
|---|---|---|---|---|
| (n) | OCN—⬡—CH$_2$—⬡—NCO + OCN(CH$_2$)$_{\overline{6}}$NCO (50) (50) | HO—CH$_2$—CO—NH—SO$_2$—NH—C$_2$H$_4$—OH + (80) HO(CH$_2$CH$_2$—O)$_2$—H (20) | — | 2.02 |

EXAMPLES 1 TO 5

A 0.30 mm thick aluminum plate was grained using a nylon brush and an aqueous suspension of 400 mesh pumice stone and then was washed with water sufficiently. The plate was etched by immesing it in 10% sodium hydroxide solution at 70° C. for 60 seconds, washed with running water, washed with 20% nitric acid and then with water. The plate thus treated was subjected to electrolytic surface roughening treatment at an anodic electricity of 160 coulomb/dm$^2$ in 1% aqueous nitric acid utilizing an alternating waved current of sign wave under a condition of $V_A = 12.7$ V. The surface roughness thereof was estimated to be 0.6 microns expressed in Ra unit. The plate was then desmutted by immersing it in 30% aqueous sulfuric acid at 55° C. for 2 minutes and thereafter it was anodized at a current density of 2 A/dm$^2$ in 20% sulfuric acid to produce aluminum oxide layer having a coverage of 2.7 g/m$^2$. Then, it was immersed in 2.5% aqueous sodium silicate solution at 70° C. for 1 minute followed by water washing and drying.

Then five light-sensitive solutions (A)-1 to (A)-5 were prepared by changing the kinds of polyurethane resins used in the composition of the following light-sensitive solution (A). These solutions each was applied onto the surface of the anodized aluminum plate obtained above and thereafter dried at 100° C. for 2 minutes to produce five PS plates (A)-1 to (A)-5. In this respect, the coated amounts of the solutions weighed after drying were 2.5 g/m$^2$.

The polyurethane resins used in the light-sensitive solutions (A)-1 to (A)-5 are summarized in Table 2 below.

Light-sensitive Solution (A)

| Component | Amount (g) |
|---|---|
| Esterified product of naphthoquinone-1,2-diazide-5-sulfonyl chloride and pyrogallol-acetone resin (see Example 1 of U.S. Pat. No. 3,635,709) | 0.45 |
| Polyurethane resin used | 0.30 |
| Cresol-formaldehyde-novolak resin | 0.80 |
| 2-(p-Methoxyphenyl)-4,6-bis(trichloromethyl)-s-triazine | 0.02 |
| Oil Blue #603 (available from ORIENT CHEMICAL INDUSTRIES, LTD.) | 0.01 |
| Ethylene dichloride | 10 |
| Methyl cellosolve | 10 |

Alternatively, a PS plate (B) (Comparative Example) was prepared by applying the following light-sensitive solution (B) in the same manner as the application of the solution (A). The coated amount of the solution weighed after drying was 2.5 g/m$^2$.

Light-sensitive Solution (B)

| Component | Amount (g) |
|---|---|
| Esterified product of naphthoquinone-1,2-diazide-5-sulfonyl chloride and pyrogallol-acetone resin (see Example 1 of U.S. Pat. No. 3,635,709) | 0.45 |
| Cresol-formaldehyde-novolak resin | 1.10 |
| 2-(p-Methoxyphenyl)-4,6-bis(trichloromethyl)-s-triazine | 0.02 |
| Oil Blue #603 (available from ORIENT CHEMICAL INDUSTRIES, LTD.) | 0.01 |
| Ethylene dichloride | 10 |
| Methyl cellosolve | 10 |

The PS plates (A)-1 to (A)-5 and (B) were exposed, through a positive transparency carrying line drawing and half-tone dots to light from a carbon arc lamp of 30A disposed at a distance of 70 cm from the plates.

The exposed PS plates (A)-1 to (A)-5 and (B) were subjected to dipping development at 25° C. for 60 seconds using a dilute aqueous solution (dilution=8 times) of a developer (available from Fuji Photo Film Co., Ltd. under the trade name of DP-4).

The resultant lithographic printing plates (A)-1 to (A)-5 and (B) each was mounted on KOR type printing press (available from Heidelberg Co., Ltd.) and printing operations were carried out utilizing a commercial ink and wood-free paper. The numbers of copies finally obtained are listed in Table II.

Table II
TABLE II

| PS plate | Polymer used | Number of printed copies |
|---|---|---|
| (A)-1 (Ex. 1) | polyurethane (a) of the present invention | 65,000 |
| (A)-2 (Ex. 2) | polyurethane (c) of the present invention | 60,000 |
| (A)-3 (Ex. 3) | polyurethane (g) of the present invention | 65,000 |
| (A)-4 (Ex. 4) | polyurethane (i) of the present invention | 70,000 |
| (A)-5 (Ex. 5) | polyurethane (m) of the present invention | 65,000 |
| (B) (Comp. Ex.) | polymer of Comparative Example | 55,000 |

As seen from Table II, it is found that the lithographic printing plates (A)-1 to (A)-5 (Examples 1 to 5) obtained by using the light-sensitive composition of this invention provide more copies than that provided by the plate (B) of Comparative Example and, therefore, the plates (A)-1 to (A)-5 are very excellent in printing durability.

EXAMPLES 6 TO 10

A 0.24 mm thick aluminum plate was grained using a nylon brush and an aqueous suspension of 400 mesh pumice stone and then was washed with water sufficiently. The plate was etched by immersing it in 10% sodium hydroxide at 70° C. for 60 seconds, washed with running water, washed with 20% nitric acid and then was subjected to electrolytic surface roughening treatment at an anodic electricity of 160 coulomb/dm$^2$ in 1% aqueous nitric acid utilizing an alternating waved current of sign wave under conditions of $V_A = 12.7$ V and $V_c = 9.1$ V. The plate was then desmutted by immersing it in 30% aqueous sulfuric acid at 55° C. for 2 minutes and thereafter it was anodized in 7% aqueous sulfuric acid solution to obtain anodized coating of 2.0 g/m$^2$ in thickness. Then, it was immersed in 3% aqueous solution of sodium silicate at 70° C. for 1 minute followed by water washing and drying.

Then, five light-sensitive solutions (C)-1 to (C)-5 were prepared by applying the following light-sensitive solutions (C)-1 to (C)-5, which had been prepared by changing the kinds of polyurethane resins used in the composition of the following light-sensitive liquid (C), onto the surface of the anodized aluminum plate thus treated utilizing a whirler and thereafter drying at 80° C. for 2 minutes to produce five PS plates (C)-1 to (C)-5. In this respect, the coated amounts of the solutions weighed after drying were 2.0 g/m².

The polyurethane resin used in each of the light-sensitive solution (C)-1 to (C)-5 is listed in Table III.

Light-sensitive Solution (C)

| Component | Amount (g) |
| --- | --- |
| 4-n-dodecylbenzenesulfonate of the condensate of 4-diazodiphenylamine and formaldehyde | 0.50 |
| Polyurethane resin used | 5.0 |
| Oil-soluble dye (Victoria Pure Blue BOH) | 0.1 |
| Malic acid | 0.05 |
| 2-Methoxyethanol | 100 |

Alternatively, a PS plate (D) (Comparative Example) was prepared in the same manner as above except that a light-sensitive solution (D) which included the following polymer instead of the polyurethane resin as used in the invention. The coated amount thereof weighed after drying was 2.0 g/m².

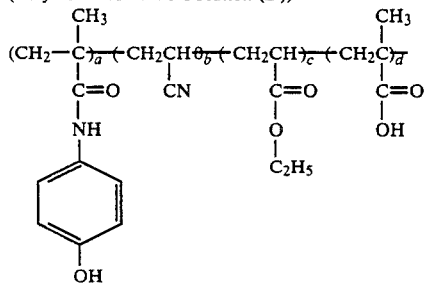

(Polymer used in the SOlution (D))

(Molar ratio, a/b/c/d/, = 9/24/58/9)

The weight averaged molecular weight of this polymer is 55,000 with respect to a standard of polystyrene.

The PS plates (C)-1 to (C)-5 and (D) thus produced were imagewise exposed to light through a negative transparency for 1 minute using PS LIGHT (available from Fuji Photo Film Co., Ltd.) at a distance of 1 m and were immersed in the following developer at room temperature for 1 minute. Then, the surface thereof was lightly rubbed with an absorbent wadding to remove unexposed areas and thus lithographic printing plates (C)-1 to (C)-5 and (D) carrying clear blue images thereon were obtained.

| (Developer) | |
| --- | --- |
| Component | Amount (g) |
| Sodium sulfite | 5 |
| Benzyl alcohol | 30 |
| Sodium carbonate | 5 |
| Sodium isopropylnaphthalene sulfonate | 12 |
| Water | 1000 |

The resultant lithographic printing plates (C)-1 to (C)-5 and (D) each was mounted on KOR type printing press (available from Heidelberg Co., Ltd.) and printing operations were carried out utilizing a commercial ink and wood-free paper. The numbers of copies finally obtained are listed in Table III.

Table III
TABLE III

| PS plate | Polymer used | Number of printed copies |
| --- | --- | --- |
| (C)-1 (Ex. 6) | polyurethane (a) of the present invention | 150,000 |
| (C)-2 (Ex. 7) | polyurethane (c) of the present invention | 140,000 |
| (C)-3 (Ex. 8) | polyurethane (e) of the present invention | 160,000 |
| (C)-4 (Ex. 9) | polyurethane (i) of the present invention | 170,000 |
| (C)-5 (Ex. 10) | polyurethane (n) of the present invention | 140,000 |
| (D) (Comp. Ex.) | polymer of Comparative Example | 100,000 |

As seen from Table III, it is found that the lithographic printing plates (C)-1 to (C)-5 (Examples 6 to 10) obtained by using the light-sensitive composition of this invention provide more copies than that provided by the plate (D) of Comparative Example and, therefore, the plates (C)-1 to (C)-5 are very excellent in printing durability.

EXAMPLES 11 TO 14

PS plates (E)-1 to (E)-4 were produced by applying the following light-sensitive solutions (E)-1 to (E)-4, which had been prepared by changing the kinds of polyurethane resins used in the composition of the following light-sensitive solution (E), onto the aluminum plate obtained in Examples 6 to 10 using a whirler and drying at 80° C. for 2 minutes. The coated amounts of the solutions weighed after drying were 2.0 g/m².

The polyurethane resins used in the light-sensitive solutions (E)-1 to (E)-4 are listed in Table IV given below.

Light-sensitive Solution (E)

| Component | Amount (g) |
| --- | --- |
| Polyurethane resin used | 5.0 |
| Trimethylolpropane triacrylate | 2.5 |
| 2-(4-styrylphenyl)-4,6-bis(trichloromethyl)-s-triazine | 0.3 |
| Oil-soluble dye (Victoria Pure Blue BOH) | 0.1 |
| 2-Methoxyethanol | 100 |

Alternatively, a PS plate (F) (Comparative Example) was produced in a similar manner as above except for using a light-sensitive solution (F) in which a copolymer (weight average molecular weight=45,000; determined using a standard of polystyrene) of benzyl methacrylate-methacrylic acid (molar ratio=73/27). The coated amount of the solution weighed after drying was 2.0 g/m².

The PS plates (E)-1 to (E)-4 and (F) thus produced were imagewise exposed to light through a negative transparency for 1 minute using PS LIGHT (available from Fuji Photo Film Co., Ltd.) at a distance of 1 m and were immersed in the developer used in Examples 6 to 10 at room temperature for 1 minute. Then, the surface thereof was lightly rubbed with an absorbent wadding to remove unexposed areas and thus lithographic printing plates (E)-1 to (E)-4 and (F) carrying clear blue images thereon were obtained.

The resultant lithographic printing plates (E)-1 to (E)-4 and (F) each was mounted on KOR type printing press (available from Heidelberg Co., Ltd.) and printing operations were carried out utilizing a commercial ink and wood-free paper. The numbers of copies finally obtained are listed in Table IV.

Table IV

TABLE IV

| PS plate | Polymer used | Number of printed copies |
|---|---|---|
| (E)-1 (Ex. 11) | polyurethane (a) of the present invention | 220,000 |
| (E)-2 (Ex. 12) | polyurethane (c) of the present invention | 210,000 |
| (E)-3 (Ex. 13) | polyurethane (e) of the present invention | 220,000 |
| (E)-4 (Ex. 14) | polyurethane (i) of the present invention | 230,00 |
| (F) (Comp. Ex.) | polymer of Comparative Example | 180,000 |

As seen from Table IV, it is found that the lithographic printing plates (E)-1 to (E)-4 (Examples 11 to 14) obtained by using the light-sensitive composition of this invention provide more copies than that provided by the plate (F) of Comparative Example and, therefore, the plates (E)-1 to (E)-4 are very excellent in printing durability.

EXAMPLES 15 AND 16

PS plates (G)-1 and (G)-2 were produced by applying the following light-sensitive solutions (G)-1 and (G)-2, which had been prepared by changing the kinds of polyurethane resins used in the following light-sensitive solution (G), onto the aluminum plate obtained in Examples 6 to 10 using a whirler and drying at 80° C. for 2 minutes. The coated amounts of the solutions weighed after drying were 2.0 g/m².

The polyurethane resins used in the light-sensitive solutions (G)-1 and (G)-2 are listed in Table V given below.

Light-sensitive Solution (G)

| Component | Amount (g) |
|---|---|
| Polyurethane resin used | 5.0 |
| Trimethylolpropane triacrylate | 2.5 |
| 2-(4-styrylphenyl)-4,6-bis(trichloromethyl)-s-triazine | 0.3 |
| Dodecylbenzene sulfonate of the condensate of 4-diazodiphenylamine and formaldehyde | 0.4 |
| Oil-soluble dye (Victoria Pure Blue BOH) | 0.1 |
| 2-Methoxyethanol | 100 |

Alternatively, a PS plate (H) (Comparative Example) was produced in a similar manner to above except for using a light-sensitive solution (H) in which a copolymer (weight average molecular weight=52,000; estimated by using a standard of polystyrene) of benzyl methacrylate-methacrylic acid (molar ratio=80/20). The coated amount of the solution weighed after drying was 2.0 g/m².

The PS plates (G)-1, (G)-2 and (H) thus produced were imagewise exposed to light through a negative transparency for 1 minute using PS LIGHT (available from Fuji Photo Film Co., Ltd.) at a distance of 1 m and were immersed in the developer used in Examples 6 to 10 at room temperature for 1 minute. Then, the surface thereof was lightly rubbed with an absorbent wadding to remove unexposed areas and thus lithographic printing plates (G)-1, (G)-2 and (H) carrying clear blue images thereon were obtained.

The resultant lithographic printing plates (G)-1, (G)-2 and (H) each was mounted on KOR type printing press (available from Heidelberg Co., Ltd.) and printing operations were carried out utilizing a commercial ink and wood-free paper. The numbers of copies finally obtained are listed in Table V.

TABLE V

| PS plate | Polymer used | Number of printed copies |
|---|---|---|
| (G)-1 (Ex. 15) | polyurethane (g) of the present invention | 190,000 |
| (G)-2 (Ex. 16) | polyurethane (j) of the present invention | 200,000 |
| (H) (Comp. Ex.) | polymer of Comparative Example | 160,000 |

As seen from Table V, it is found that the lithographic printing plates (G)-1 and (G)-2 (Examples 15 and 16) obtained by using the light-sensitive composition of this invention provide more copies than that provided by the plate (H) of Comparative Example and, therefore, the plates (G)-1 and (G)-2 are very excellent in printing durability.

What is claimed is:

1. A light-sensitive composition comprising, in admixture, (i) a light-sensitive positive working o-quinone diazide compound in an amount of from 10 to 50% by weight or a light-sensitive negative working diazonium compound in an amount of from 1 to 50% by weight, based on the total weight of the composition and (ii) an aqueous alkaline-soluble polyurethane resin having a N-sulfonyl-amido groups in an amount of from 5 to 90% by weight based on the total weight of the composition, the polyurethane resin having a structure, as basic skeleton, derived from a reaction product of diisocyanate compound represented by the following formula (I) with a diol compound represented by the following formula (II), (III), (IV) or (V):

$$OCN-R_1-NCO \qquad (I)$$

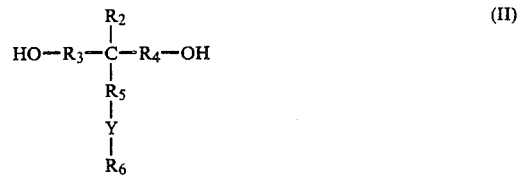

$$HO-R_3-\underset{\underset{\underset{R_6}{|}}{\underset{Y}{|}}}{\underset{R_5}{|}}{\overset{R_2}{\underset{|}{C}}}-R_4-OH \qquad (II)$$

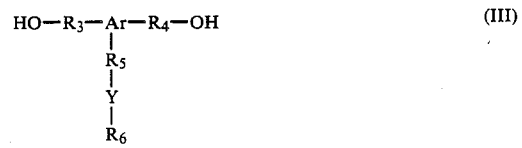

$$HO-R_3-\underset{\underset{\underset{R_6}{|}}{\underset{Y}{|}}}{\underset{R_5}{|}}{Ar}-R_4-OH \qquad (III)$$

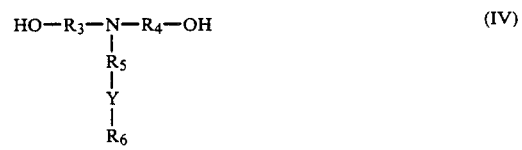

$$HO-R_3-\underset{\underset{\underset{R_6}{|}}{\underset{Y}{|}}}{\underset{R_5}{|}}{N}-R_4-OH \qquad (IV)$$

$$HO-R_3-Y-R_4-OH \qquad (V)$$

wherein
- $R_1$ represents a bivalent aliphatic or aromatic hydrocarbon group which may have substituents selected from the group consisting of alkyl, aralkyl, aryl, and alkoxy groups and halogen atoms, with the proviso that $R_1$ may have other functional groups which are not reactive with the isocyanate groups;
- $R_2$ represents a hydrogen atom or an alkyl, aralkyl, aryl, alkoxy or aryloxy group which may have substituents selected from the group consisting of cyano, nitro, halogen atoms, $-CONH_7$, $-COOR_7$, $-NHCONHR_7$, $-NHCOOR_7$, $-NHCOR_7$, $-OCONHR_7$, and $-CONHR_7$, wherein $R_7$ represents an alkyl group having 1 to 15 carbon atoms;
- $R_3$, $R_4$, and $R_5$, may be the same or different and each represents a single bond or bivalent aliphatic or aromatic hydrocarbon group which may have substituents selected from the group consisting of alkyl groups, aralkyl groups, aryl groups, alkoxy groups and halogen atoms, provided that $R_3$ to $R_5$ may optionally have other functional groups which do not react with the isocyanate groups and that two or three of $R_2$ to $R_5$ may optionally have other functional groups which do not react with the isocyanate groups and that two or three of $R_2$ to $R_5$ may form a ring together with the carbon atoms to which these are bonded;
- $R_6$ represents a monovalent aliphatic or aromatic hydrocarbon group which may have substituents selected from the group consisting of alkyl groups, alkoxy groups and halogen atoms;
- Ar represents a trivalent aromatic hydrocarbon group optionally having substituents, and Y denotes N-sulfonylamido group.

2. A light-sensitive composition of claim 1 wherein $R_2$ is a hydrogen atom, an alkyl group having 1 to 8 carbon atoms or an aryl group having 6 to 15 carbon atoms; $R_3$ to $R_5$ each represents an alkylene group having 1 to 20 carbon atoms or an arylene group having 6 to 15 carbon atoms; $R_6$ represents an alkyl group having 1 to 20 carbon atoms, an aryl group having 6 to 15 carbon atoms or an aralkyl group having 7 to 15 carbon atoms; and Ar is a trivalent aromatic group having 6 to 15 carbon atoms.

3. A light-sensitive composition of claim 1 wherein the molar ratio of the diisocyanate to the diol ranges from 0.8:1 to 1.2:1.

4. A light-sensitive composition of claim 1 wherein the weight averaged molecular weight of the polyurethane resin is at least 1,000.

5. A light-sensitive composition of claim 1 wherein the amount of the polyurethane resin ranges from about 10 to 60% by weight of the composition.

6. A light-sensitive composition of claim 1 wherein the positive-working o-quinonediazide compound is selected from the group consisting of esters of 1,2-diazonaphthoquinone sulfonic acid chloride and pyrogallol-acetone resin, and esters of 1,2-diazonaphthoquinone sulfonic acid chloride and pyrogallol-formaldehyde resin.

7. A light-sensitive composition of claim 1 wherein the negative-working diazonium compound is selected from the group consisting of hexafluorophosphates, tetrafluorophosphates and phosphates of condensates of p-diazodiphenylamine with formaldehyde or acetaldehyde; sulfonates, phosphinates, salts with hydroxyl group-containing compounds and organic carboxylates of condensates of p-diazodiphenylamine and formaldehyde; and those obtained by condensing 3-methoxy-4-diazo-diphenylamine and 4,4'-bis-methoxy-methyl diphenyl ether and then converted to mesitylene sulfonate.

8. A light-sensitive composition of claim 1 wherein it further comprising alkali-soluble polymer selected from the group consisting of phenol-formaldehyde resin, phenol-modified xylene resin, polyhydroxystyrene, halogenated polyhydroxystyrene, carboxyl group-containing epoxy resin, polyacetal resin, acrylic resin and methacrylic resin, in an amount of not more than 70% by weight of the composition.

9. A light-sensitive composition of claim 1 wherein it further comprising agents or compositions for obtaining a visible image immediately after imagewise exposure; dyes or pigments; stabilizers; surfactants; and/or plasticizers.

10. A light-sensitive composition of claim 1 wherein the light-sensitive compound is the positive-working o-quinonediazide compound and the composition further comprises at least one cyclic acid anhydride selected from the group consisting of phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, alpha-phenylmaleic anhydride, succinic anhydride and pyromellitic anhydride, in an amount of 1 to 15% by weight of the composition.

* * * * *